US006720204B2

United States Patent
Sudijono et al.

(10) Patent No.: US 6,720,204 B2
(45) Date of Patent: Apr. 13, 2004

(54) METHOD OF USING HYDROGEN PLASMA TO PRE-CLEAN COPPER SURFACES DURING CU/CU OR CU/METAL BONDING

(75) Inventors: John Leonard Sudijono, Singapore (SG); Yakub Aliyu, Singapore (SG); Mei Sheng Zhou, Singapore (SG); Simon Chooi, Singapore (SG); Subhash Gupta, Singapore (SG); Sudipto Ranendra Roy, Singapore (SG); Paul Kwok Keung Ho, Singapore (SG); Yi Xu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/120,836

(22) Filed: Apr. 11, 2002

(65) Prior Publication Data

US 2003/0192943 A1 Oct. 16, 2003

(51) Int. Cl.$^7$ ............................................... H01L 21/44
(52) U.S. Cl. ..................................................... 438/106
(58) Field of Search ................................ 438/106, 115, 438/745, 798; 219/121.46, 121.45

(56) References Cited

U.S. PATENT DOCUMENTS

| 5,559,056 | A | 9/1996 | Weiler ......................... 437/195 |
| 5,719,087 | A | 2/1998 | Chen et al. .................. 438/612 |
| 5,824,234 | A | 10/1998 | Jou et al. ....................... 216/18 |
| 5,985,765 | A | 11/1999 | Hsiao et al. ................. 438/694 |
| 6,320,155 | B1 | * 11/2001 | Barnett ................... 219/121.46 |
| 6,355,576 | B1 | * 3/2002 | Haley et al. ................. 438/745 |
| 2002/0127825 | A1 | * 9/2002 | Mui et al. .................... 438/474 |

OTHER PUBLICATIONS

Nowful et al., "Effects of Plasma Cleaning on the Reliability of Wire Bonding", Nov. 2001, Advances in Electronic Materia and Packaging, pp. 39–43.*
Wood et al., "Plasma Cleaning of Chip Scale Packages for Improvement of Wire Bond Strength", Dec. 2000, Internationa Symposium on Electronic Materials and Packaging, pp. 406–408.*
Wolf, Silicon Processing for the VLSI Era vol 2: Process Integration, 1990, 273–276.*
Wolf & Tauber, Silicon Processing for the VLSI Era vol. 1: Process Technology, 1986, pp. 542–547.*

* cited by examiner

*Primary Examiner*—Evan Pert
(74) *Attorney, Agent, or Firm*—George O. Saile; Rosemary L. S. Pike; Stephen G. Stanton

(57) ABSTRACT

A method of bonding a wire to a metal bonding pad, comprising the following steps. A semiconductor die structure having an exposed metal bonding pad within a chamber is provided. The bonding pad has an upper surface. A hydrogen-plasma is produced within the chamber from a plasma source. The metal bonding pad is pre-cleaned and passivated with the hydrogen-plasma to remove any metal oxide formed on the metal bonding pad upper surface. A wire is then bonded to the passivated metal bonding pad.

18 Claims, 3 Drawing Sheets

METHOD OF USING HYDROGEN PLASMA TO PRE-CLEAN COPPER SURFACES DURING CU/CU OR CU/METAL BONDING

FIELD OF THE INVENTION

The present invention relates generally to bonding pad formation used in integrated circuits, and specifically to an improved method of attaching a Cu wire to a Cu bonding pad.

BACKGROUND OF THE INVENTION

Bond pads are electrically connected to device elements within the semiconductor die structure and provide exposed contact regions of the die permitting electrical connection to components external to the die. Typically, a bonding wire, for example copper, is bonded to the bonding pad at one end and a portion of the lead frame at the other end.

Bonding pads may consist of copper. However, natural oxidation of the copper (Cu) bonding pad surface leads to $CuO_2$ formation resulting in an undesirable high contact resistance between the Cu wire and Cu metal pad during the bonding process.

U.S. Pat. No. 5,985,765 to Hsiao et al. describes a process to etch the passivation opening over a bonding pad (BP). A capping layer, having a low etch rate, is formed on the bonding pads to prevent their over-etching while fuse openings are etched to the desired depth in the thicker insulating layers.

U.S. Pat. No. 5,824,234 to Jou et al. describes a process of removing fluorine-containing polymers and metal fluoride formed in the etching process from over a bonding pad, reducing the contact resistance.

U.S. Pat. No. 5,559,056 to Weiler describes a method for fabricating bonding pads that utilizes a metal capping layer over a bonding pad that is produced with only two mask and etch steps. The bond pad will withstand ambient temperatures up to approximately 200° C. Weiler describes a capping method and arrangement which prevents corrosion of the metallization layer and prohibits intermetallic growth between the bond pad and the bonding wire.

U.S. Pat. No. 5,719,087 to Chen et al. describes a process protecting a bonding pad from damage by covering the bonding pad with a protective cap of a dielectric material prior to final passivation that protects the bonding pad from a solution suitable to etch contact holes in the final passivation layer.

SUMMARY OF THE INVENTION

Accordingly, it is an object of the present invention to provide a method of attaching a wire to a metal bonding pad that reduces contact resistance.

A further object of the present invention is to provide a method of attaching a copper wire to a copper bonding pad that provides for a stronger contact between the copper wire and the copper bonding pad.

Yet another object of the present invention is to provide a method of attaching a copper wire to a copper bonding pad that provides for better reliability.

Other objects will appear hereinafter.

It has now been discovered that the above and other objects of the present invention may be accomplished in the following manner. Specifically, a semiconductor die structure having an exposed metal bonding pad within a chamber is provided. The bonding pad has an upper surface. A hydrogen-plasma is produced within the chamber from a plasma source. The metal bonding pad is pre-cleaned and passivated with the hydrogen-plasma to remove any metal oxide formed on the metal bonding pad upper surface. A wire is then bonded to the passivated metal bonding pad.

BRIEF DESCRIPTION OF THE DRAWINGS

The features and advantages of the method of attaching a wire to a metal bonding pad according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
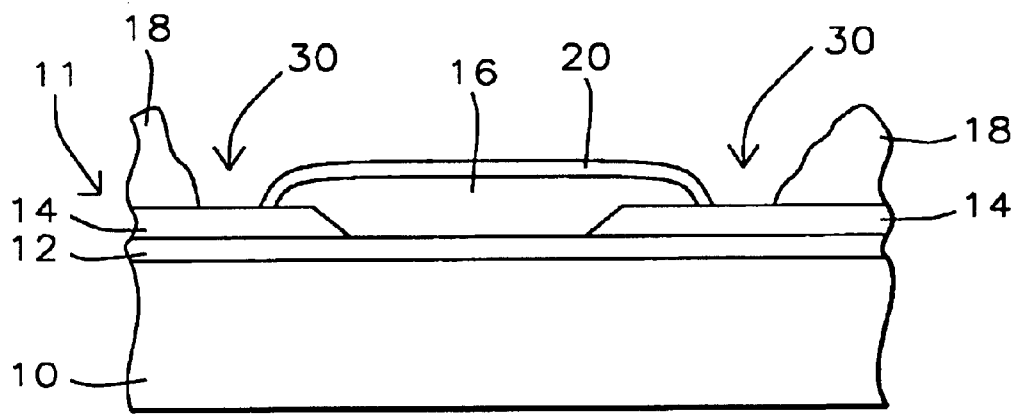
FIGS. 1 to 3 schematically illustrate in cross-sectional representation a preferred embodiment of the present invention.

Accordingly FIG. 1 shows a schematic cross-sectional diagram of metal bonding pad 16 of an integrated circuit that includes semiconductor die structure 10 within a chamber.

Semiconductor die structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor die structure" is meant to include devices formed within a semiconductor wafer and the layers overlying the wafer.

Unless otherwise specified, all structures, layers, etc. may be formed or accomplished by conventional methods known in the prior art.

Metal bonding pad 16 may be comprised of aluminum (Al) or aluminum copper alloy (Al—Cu), and preferably copper, and contacts underlying circuitry 12 that may be covered by insulating dielectric layer 14. Protective passivation layer 18 is shown on top of the integrated circuit through which contact hole 30 has been etched open above bonding pad 16 to permit electrical contact to bonding pad 16.

Contact hole 30 is etched open at a final stage in integrated circuit fabrication as a wafer comprising a multitude of integrated circuits before separation into individual circuit dice.

Bonding pad structure 11 shown in FIG. 1 is only illustrative of a bonding pad structure and is not intended to be limiting.

Metal bonding pad 16 may have natural oxidized layer 20 thereover caused by reaction of metal bonding pad 16 with water vapor in the ambient atmosphere. For example copper bonding pad 16 would have $CuO_2$ layer 20 thereover which would result in undesired contact resistance between wire 24 (see FIG. 3) and metal bonding pad 16 during the bonding process.

As necessary, bonding pad 11 may be masked in the area of non-interest (not shown) so as to minimize any damage due to the pending plasma power. It is noted that for modern intelligent bonders, masking is not required.

Figure 2:
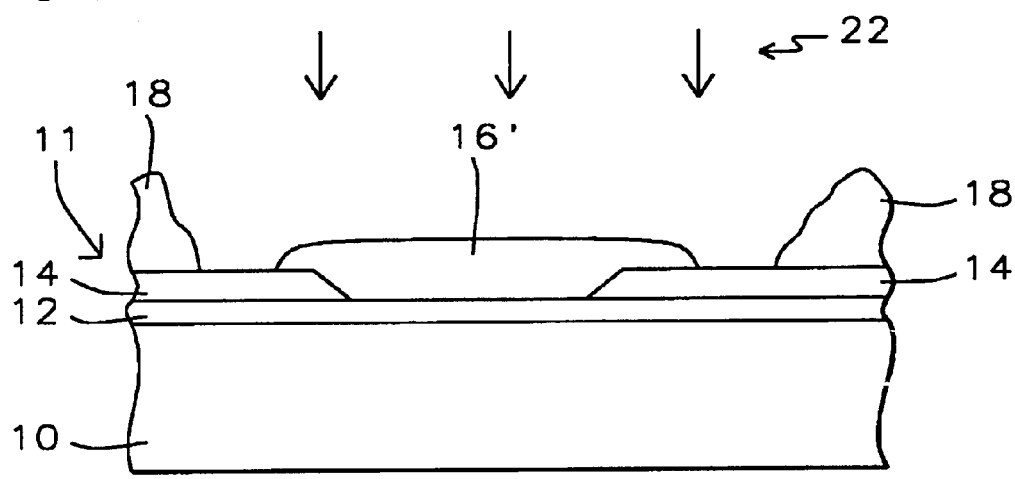

As shown in FIG. 2, bonding pad structure 11 may be transferred to a separate plasma chamber within which hydrogen-plasma is generated. The process of the present invention is preferably done within a bonding tool having a separate plasma chamber.

Figure 4A:
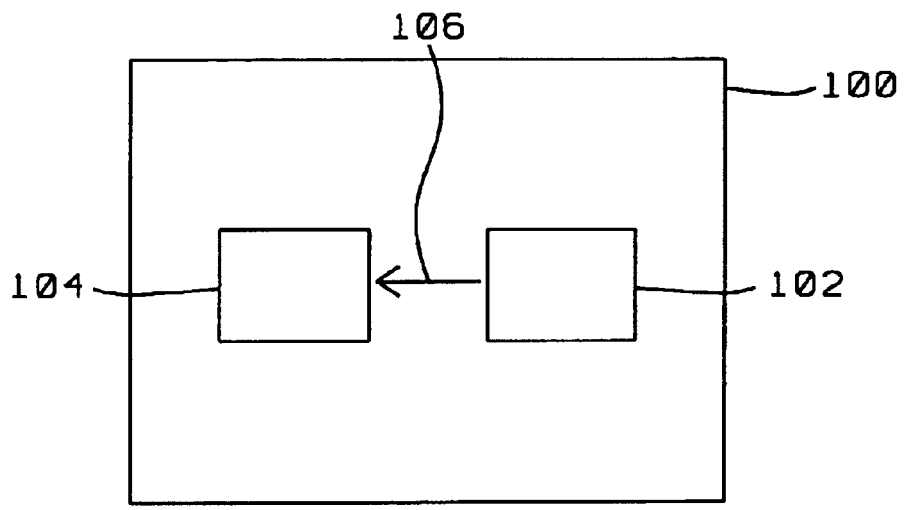
FIGS. 4A and 4B schematically illustrate example tool configurations with which the present invention may be practiced.

For example, FIG. 4A illustrates an enclosure 100 having $H_2$ plasma tool 102 and bonding tool 104 connected by transfer mechanism 106 by which wafer 10 (not shown) is transferred between tools 102, 104. Enclosure 100 is purged with $N_2$.

Figure 4B:
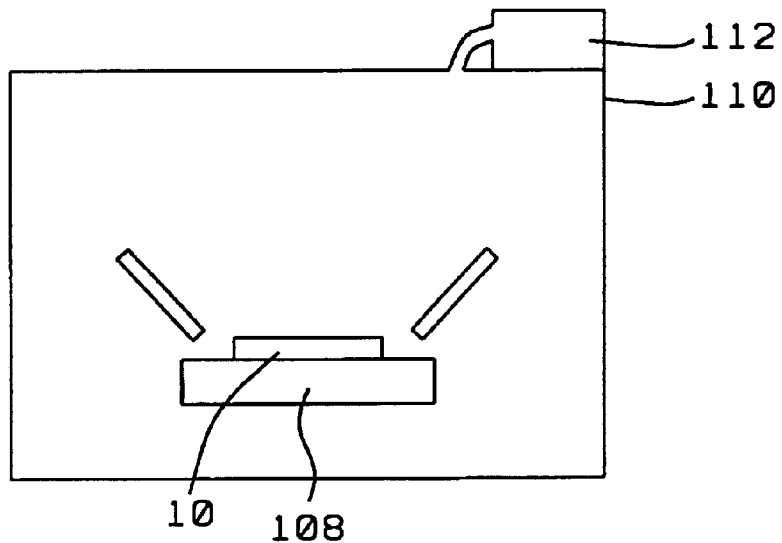

FIG. 4B illustrates an alternate arrangement wherein two tools are in one. Wafer 10 is secured on wafer chuck 108 within dual tool 110 (H2 plasma tool and bonding tool). Plasma source 112 communicates with enclosure 110 (hence downstream plasma). $H_2$ plasma is provided to enclosure 110 from plasma source 112. The bonding tool function may be a thermocompression or a thermosonic.

Figure 5A:
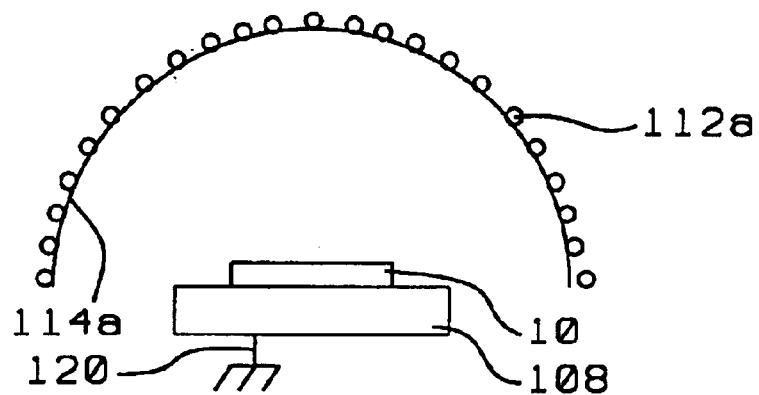
FIGS. 5A and 5B schematically illustrate example ICP reactors with which the present invention may be practiced.
Figure 5B:
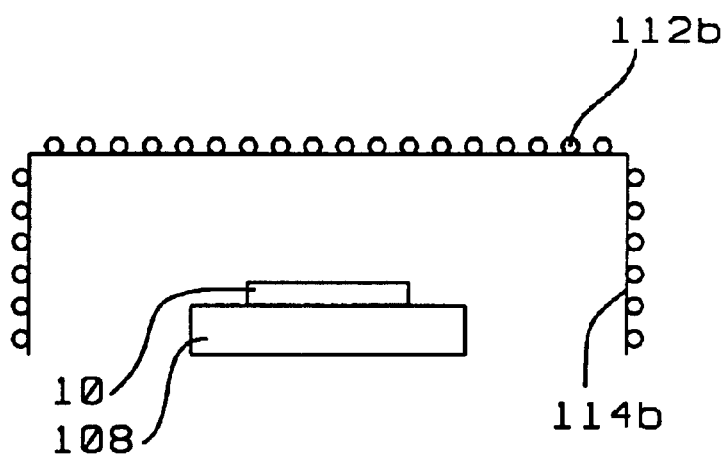

Hydrogen-plasma 22 is generated by a plasma source (not shown) that may either be direct (such as a parallel plate with RF), or downstream so as to further reduce damage. The hydrogen source may be $NH_3$, $H_2$, $N_2+H_2$, $He+H_2$, or $Ar+H_2$ and the hydrogen-plasma is formed under the following parameters:

power: from about 50 to 200 W for parallel plate; or from about 250 to 800 W for downstream;

time: from about 10 to 60 seconds, and more preferably less than about 30 seconds;

$H_2$ flow (as selected): from about 50 to 500 sccm;

He or $N_2$ flow (as selected): from about 100 to 1000 sccm;

$NH_3$ flow (as selected): from about 50 to 500 sccm;

FIGS. 5A and 5B illustrate generalized example configurations of inductive coupled plasma (ICP) reactors. As illustrated in FIG. 5A, wafer 10 is secured on wafer chuck 108 with ground 120 within a first ICP reactor. Semicircular plate 114a is spaced apart from wafer chuck 108. RF power flows through coils 112a to provide the $H_2$ plasma 22. As illustrated in FIG. 5B, wafer 10 is secured on wafer chuck 108 within a second ICP reactor. Partially rectangular plate 114b is spaced apart from wafer chuck 108. RF power flows through coils 112b to provide the $H_2$ plasma 22.

Hydrogen-plasma 22 pre-cleans and passivates metal bonding pad 16, removing oxidized layer 20. The passivation retards any further oxidation of metal bonding pad 16 and to form passivated metal bonding pad 16'.

Figure 3:
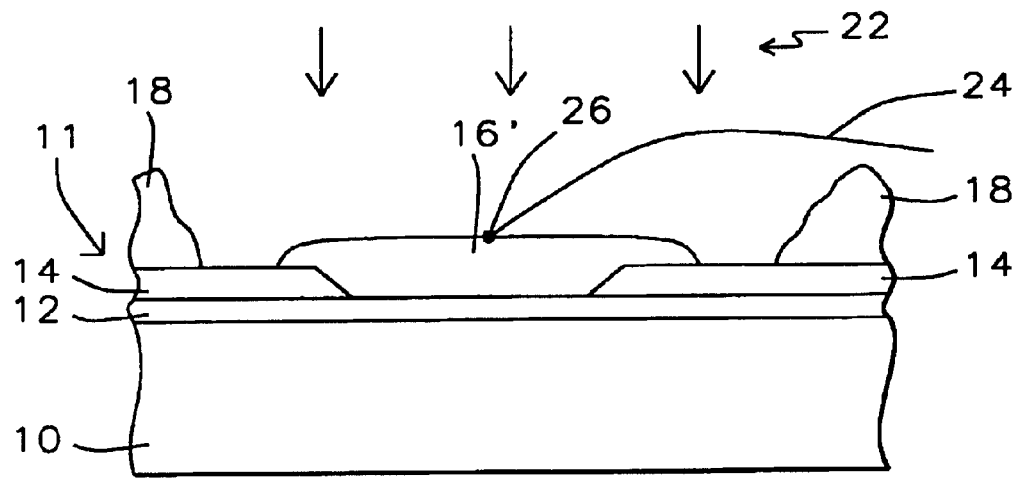

As shown in FIG. 3, and while bonding pad structure 11 is still within hydrogen-plasma environment 22, wire 24 is bonded to passivated metal bonding pad 16' at 26 thus reducing the contact resistance. Passivated metal bonding pad 16' also permits a stronger contact with wire 24 and makes for better reliability.

Wire 24 may be bonded to bonding pad 16' by a thermocompression or thermosonic method.

Wire 24 may be comprised of gold (Au) or copper (Cu) alloy, and is preferably copper.

While particular embodiments of the present invention have been illustrated and described, it is not intended to limit the invention, except as defined by the following claims.

We claim:

1. A method of bonding a wire to a metal bonding pad, comprising the steps of:

providing a semiconductor die structure having an exposed metal bonding pad within a chamber; said bonding pad having an upper surface;

producing a hydrogen-plasma within said chamber from a plasma source;

pre-cleaning and passivating said metal bonding pad with said hydrogen-plasma to remove any metal oxide formed on said metal bonding pad upper surface; and bonding a wire to said cleaned and passivated metal bonding pad while the metal bonding pad is within the hydrogen-plasma.

2. The method of claim 1, wherein said metal bonding pad is comprised of a material selected from the group comprising Al, Al-Cu, and Cu, and said wire is comprised of a material selected from the group comprising Au, a copper alloy and copper.

3. The method of claim 1, wherein said plasma source is direct.

4. The method of claim 1, wherein said plasma source is a parallel plate with RF.

5. The method of claim 1, wherein said plasma source is downstream.

6. The method of claim 1, wherein said hydrogen source is selected from the group comprising $NH_3$, $H_2$, $N_2+H_2$, $He+H_2$ and $Ar+H_2$.

7. The method of claim 1, further including the step of masking said semiconductor die structure to expose said metal bonding pad before said hydrogen-plasma production step.

8. A method of bonding a copper wire to a copper bonding pad, comprising the steps of:

providing a semiconductor die structure having an exposed copper bonding pad within a chamber; said copper bonding pad having an upper surface;

producing a hydrogen-plasma within said chamber from a plasma source;

pre-cleaning and passivating said copper bonding pad with said hydrogen-plasma to remove any copper oxide formed on said copper bonding pad upper surface; and bonding a copper wire to said passivated copper bonding pad while the copper bonding pad is within the hydrogen-plasma.

9. The method of claim 8, wherein said plasma source is direct.

10. The method of claim 8, wherein said plasma source is a parallel plate with RF.

11. The method of claim 8, wherein said plasma source is downstream.

12. The method of claim 8, wherein said hydrogen source is selected from the group comprising $NH_3$, $H_2$,, $N_2+H_2$, $He+H_2$, and $Ar+H_2$.

13. The method of claim 8, further including the step of masking said semiconductor die structure to expose said copper bonding pad before said hydrogen-plasma production step.

14. A method of bonding a copper wire to a copper bonding pad, comprising the steps of:

providing a semiconductor die structure having an exposed copper bonding pad within a chamber; said copper bonding pad having an upper surface;

producing a hydrogen-plasma within said chamber from a plasma source; said hydrogen-source being selected from the group comprising $NH_3$, $H_2$,, $N_2+H_2$, $He+H_2$, and $Ar+H_2$;

pre-cleaning and passivating said copper bonding pad with said hydrogen-plasma to remove any copper oxide formed on said copper bonding pad upper surface; and bonding a copper wire to said passivated copper bonding pad while the copper bonding pad is within the hydrogen-plasma.

15. The method of claim 14, wherein said plasma source is direct.

16. The method of claim 14, wherein said plasma source is a parallel plate with RF.

17. The method of claim 14, wherein said plasma source is downstream.

18. The method of claim 14, further including the step of masking said semiconductor die structure to expose said copper bonding pad before said hydrogen-plasma production step.

* * * * *